United States Patent [19]

Parsons

[11] Patent Number: 4,732,110
[45] Date of Patent: Mar. 22, 1988

[54] INVERTED POSITIVE VERTICAL FLOW CHEMICAL VAPOR DEPOSITION REACTOR CHAMBER

[75] Inventor: James D. Parsons, Newbury Park, Calif.

[73] Assignee: Hughes Aircraft Company, Los Angeles, Calif.

[21] Appl. No.: 45,258

[22] Filed: Apr. 20, 1987

Related U.S. Application Data

[63] Continuation of Ser. No. 489,919, Apr. 29, 1983, abandoned.

[51] Int. Cl.$^4$ .............................................. C23C 16/00
[52] U.S. Cl. .................................. 118/719; 118/725; 156/613; 156/DIG. 98
[58] Field of Search ............... 118/715, 719, 728, 725; 156/613, DIG. 98; 427/248.1; 422/245

[56] References Cited

U.S. PATENT DOCUMENTS

| | | | |
|---|---|---|---|
| 3,338,209 | 8/1967 | Bhola | 118/715 |
| 3,366,516 | 1/1968 | McAleer et al. | 156/613 |
| 3,386,866 | 6/1968 | Ebert et al. | 156/613 |
| 3,607,378 | 9/1971 | Rugglero | |
| 3,619,283 | 11/1971 | Carpenter et al. | 156/613 |
| 3,781,152 | 12/1973 | Keller et al. | 118/728 |
| 4,232,063 | 11/1980 | Rosler et al. | 118/728 |
| 4,239,955 | 12/1980 | Cho | 219/271 |
| 4,258,658 | 4/1981 | Politycki et al. | 118/719 |

FOREIGN PATENT DOCUMENTS

| | | |
|---|---|---|
| 1398758 | 4/1965 | France . |
| 1462335 | 12/1965 | France . |
| 2439895 | 5/1980 | France . |
| 51187 | 10/1978 | Japan . |

OTHER PUBLICATIONS

Workpiece Holder, IBM Technical Disclosure, vol. 20, No 1, Jun. 1977, pp. 228.
L. H. Kaplan et al, Deposition Method for Aluminum Oxide Films, IBM Technical Disclosure Bulletin, vol. 7, No. 5, Oct. 1964, pp. 414-415.
K. Ulbrich, Laminar Diffuser Head for Continuous CVD Devices with U-Shaped Carriers, IBM Technical Disclosure Bulletin, vol. 22, No. 9, Feb. 1980, pp. 3972, 3973.

*Primary Examiner*—David L. Lacey
*Attorney, Agent, or Firm*—Wanda K. Denson-Low; A. W. Karambelas

[57] ABSTRACT

A chemical vapor deposition (CVD) reactor system is described comprising a substantially vertical reactor tube having a gas inlet and a gas outlet, a pedestal mounted within the reactor tube having a structure for securing a substrate thereto so that a surface of the substrate is exposed downward, and apparatus for providing a gas mixture to the reactor tube, the gas mixture being introduced into the reactor tube via the gas inlet and subsequently withdrawn via the gas outlet, the gas inlet and outlet being positioned, with respect to the substrate, below and above, respectively. The gas mixture is maintained in substantially uniform plug flow as it is directed into close proximity to the exposed surface of the substrate. This permits the CVD growth of physically uniform layers, both in terms of thickness and composition, having low contamination concentrations over large substrate surface areas.

16 Claims, 6 Drawing Figures

INVERTED POSITIVE VERTICAL FLOW CHEMICAL VAPOR DEPOSITION REACTOR CHAMBER

This application is a continuation of application Ser. No. 489,919, filed Apr. 29, 1983, now abandoned.

BACKGROUND OF THE INVENTION

1. Field of the Invention

The present invention generally relates to chemical vapor deposition (CVD) reactor systems and, more particularly, to inverted CVD reactor chambers that use a vertical reactant gas flow to permit the growth of semiconductor, insulator, and metal layers having uniform physical and electrical characteristics.

2. Description of the Prior Art

CVD reactor systems may be used for the deposition of homoepitaxial, heteroepitaxial, and polycrystalline layers of semiconductors, insulators, and metals (hereinafter generally referred to as epitaxial and dielectric layers) on the surface of semiconductor substrates. The layers are deposited as a result of a pyrolytic decomposition reaction of reactant gas phase compounds transported into close proximity with the substrate by a carrier gas, typically hydrogen. The substrate is at a temperature above that necessary to initiate the thermal decomposition of the reactant gas compounds. Thus for example, a silicon epitaxial layer can be grown on the surface of a silicon substrate by the pyrolytic decomposition of silane. A gallium arsenide epitaxial layer may be epitaxially grown on a gallium arsenide substrate by the decomposition of trimethyl gallium and arsine. Dielectric layers of, for example, oxide and nitride compounds can be grown through the pyrolytic decomposition of appropriate gasous phase reactant compounds in oxygen and nitrogen ambients. Doping of epitaxial layers can be accomplished by including additional reactant gas phase compounds in the reactant gas mixture. Upon decomposition of the additional compounds, the various doping species are deposited on the growth surface of the epitaxial layer and are incorporated therein.

In the design of CVD reactor systems, substantial emphasis is placed on enabling the growth of physically uniform, high electrical quality layers. This is particularly desirable in the growth of epitaxial semiconductor layers, since uniformly thin epitaxial layers grown over large substrate surface areas are required for the subsequent fabrication of LSI and VLSI integrated circuits. The ability to obtain epitaxial layers having specific carrier concentrations and dopant concentration profiles across several sequentially grown epitaxial layers is equally of importance. Further, the ability to grow both epitaxial and dielectric layers having extremely low contaminant and defect densities is important in obtaining the desired optimum electrical characteristics.

In CVD reactor systems, two related phenomena are recognized as contributing to unpredictable variations in the carrier concentration and doping density profile of CVD grown epitaxial layers and for the introduction of contaminants into both epitaxial and dielectric CVD grown layers. The first phenomenon is generally referred to as autodoping. This phenomenon is typically encountered in the growth of an effectively or near intrinsic semiconductor epitaxial layer, such as low impurity silicon or high resistivity gallium arsenide. Characteristically, the resultant epitaxial layers are found to have a significant impurity concentration; the impurities effectively acting as dopants and, thereby, preventing the accurately reproducible growth of the desired epitaxial layers. These impurities are conventionally thought to arise from contaminants present in the reactant gases and from the exposed surfaces of the structures necessarily present within the reactor system. Naturally, these same contaminants produce defects and unpredictable electrical quality variations in both epitaxial and dielectric layers grown by CVD.

The second phenomenon is generally referred to as the memory effect. This phenomenon is principally encountered during the growth of a semiconductor epitaxial layer. Unlike the autodoping phenomenon, the impurity sources giving rise to the memory effect phenomenon are known and well appreciated. The memory effect impurities are essentially the dopants intentionally utilized to dope previously grown epitaxial layers and the semiconductor substrate itself. In particular, a residual amount of the dopant transport compound utilized during a previous CVD growth may be effectively delayed or temporarily trapped within the CVD reactor system and, therefore, only reaches the epitaxial growth surface during a subsequent epitaxial layer growth. The delay or trapping of the dopant transport compound may be due to the presence of "dead spaces" within the reactor system, wherein the gaseous dopant compound languishes and only slowly diffuses back into the main flow of reactant gases moving toward the substrate.

A similar delay is introduced when a portion of the gaseous dopant transport compound is allowed to condense onto any of the inner surfaces of the reactor system. The dopant transport compound evaporates at some time thereafter and re-enters the main reactant gas flow.

Another impurity source giving rise to the memory effect phenomenon is created by the improper deposition of a dopant during an epitaxial growth onto an inner surface of the reactor chamber and not, as intended, onto the growth surface of the epitaxial layer. In a subsequent epitaxial growth, given that the improper deposition is onto a heated surface, some portion of the dopant species will evaporate and eventually become incorporated into the growing epitaxial layer. Naturally, the carrier concentration and doping profile will be unpredictably affected due to the unpredictable rate of evaporation.

Finally, the last recognized impurity sources giving rise to the memory effect phenomenon are the previously grown epitaxial layers and the substrate. Since the substrate is directly heated, along with any existing epitaxial layers during the growth of a succeeding epitaxial layer, a significant amount of the dopants will out-diffuse from these layers and become incorporated in the growing epitaxial layer.

Although there are a number of different impurity sources giving rise to the memory effect, the result in each case is the same. The impurities, acting as dopants, either partially compensate and decrease or directly and accumulatively increase the carrier concentration of the epitaxial layer being grown. Further, the dopant concentration profile across both the junction to the underlying epitaxial layer and within the growing epitaxial layer is unpredictable due to the equally unpredictable quantity and rate of arrival of the impurity dopant at the growth surface of the epitaxial layer. Consequently, the ability to accurately grow either abrupt or controllably graded homojunctions and heterojunctions, as well as simple uniformly doped epitaxial layers, is severly restricted.

The failure to achieve high physical uniformity, both in terms of thickness and composition, is another well recognized problem in the CVD growth of epitaxial layers. Non-uniform layer thicknesses directly result from the failure to uniformly deposit the various constituent components of the growing epitaxial layer evenly over the entire epitaxial growth surface. Likewise, non-uniformities in the composition of the grown epitaxial layer arise from the failure to uniformly deposit the appropriate proportions of each of the constituent components of the epitaxial material to achieve the desired stoichiometric composition.

Numerous reactor designs have been developed to specifically correct the physical non-uniformity problem. These designs treat the problem as principally arising from the depletion, through decomposition, of the reactant gases present through the length of the reactor chamber (U.S. Pat. Nos. 4,279,947 and 3,922,467), the varying distance of different areas of the epitaxial growth surface from the reactant gas inlet (U.S. Pat. Nos. 4,062,318 and 3,633,537), and convection currents generated in the reactive gases immediately adjacent the heated substrate as a result of the substantial thermal gradient necessary to induce the decomposition of the gases (U.S. Pat. No. 3,916,822). The device disclosed in this last patent provides for the creation of a convection-current free zone immediately adjacent an invertly mounted semiconductor substrate. An inlet manifold provides a continuing supply of reactant gases to a diffusing radiation shield. The reactant gases pass through the radiation shield and diffuse through the convection-current free zone into close proximity with the substrate surface. Following decomposition, the remaining vapor-phase reaction products then diffuse back through the convection-current free zone and the radiation shield to exit downwardly from the reaction chamber. The thickness variation reportedly achieved by the disclosed device is 4% over the surface area of a conventional 1.5 inch diameter semiconductor wafer. Though this is apparently the minimum thickness variation achieved in the entire prior art, it is still nearly twice the thickness variation that is estimated to be tolerable in the fabrication of LSI and VLSI integrated circuits prepared utilizing CVD epitaxial layer growth. The composition variation in epitaxial layers grown utilizing the disclosed device are not reported. The best composition variation reported in the prior art is apparently on the order of ±10% over a surface area of 15 cm².

SUMMARY OF THE INVENTION

The general purpose of the present invention is to provide for the CVD growth of physically uniform epitaxial layers having desirable and consistantly reproducible electrical characteristics.

This is attained in accordance with the present invention by providing in a chemical vapor deposition (CVD) reactor system, a CVD reactor chamber comprising a substantially vertical reactor tube having a gas inlet and a gas outlet, a pedestal mounted within the reactor tube having means for securing a substrate thereto so that a surface of the substrate is exposed downward, and means for providing a gas mixture to the reactor tube, the gas mixture being introduced into the reactor tube via the gas inlet and subsequently withdrawn via the gas outlet, the gas inlet and outlet being positioned, with respect to the substrate, below and above, respectively. The gas mixture is maintained in substantially uniform plug flow as it is directed into close proximity to the exposed surface of the substrate.

Thus, an advantage of the present invention is that it permits the growth of physically uniform epitaxial layers, both in terms of thickness variation (considerably less than 4%) and material composition variation (considerably less than 10%) over substrate surface areas equal to at least that of commercially standard size substrates.

Another advantage of the present invention is that it permits the growth of epitaxial layers having percisely graded and reproducible dopant profiles and, further, the sequential growth of epitaxial layers having either abrupt or precisely graded junctions thereinbetween.

A further advantage of the present invention is that it permits the growth of epitaxial layers having no significant level of autodoping or delayed doping such that may give rise to a memory effect phenomenon.

Yet another advantage of the present invention is that it can be used to provide for the growth of epitaxial layers on several separate substrates simultaneously.

BRIEF DESCRIPTION OF THE DRAWINGS

These and other attendant advantages of the present invention will become apparent and readily appreciated as they become better understood by reference to the following detailed description when considered in connection with the accompanying drawings in which like reference numerals designate like parts throughout the figures and wherein.

DETAILED DESCRIPTION OF THE INVENTION

Figure 1:
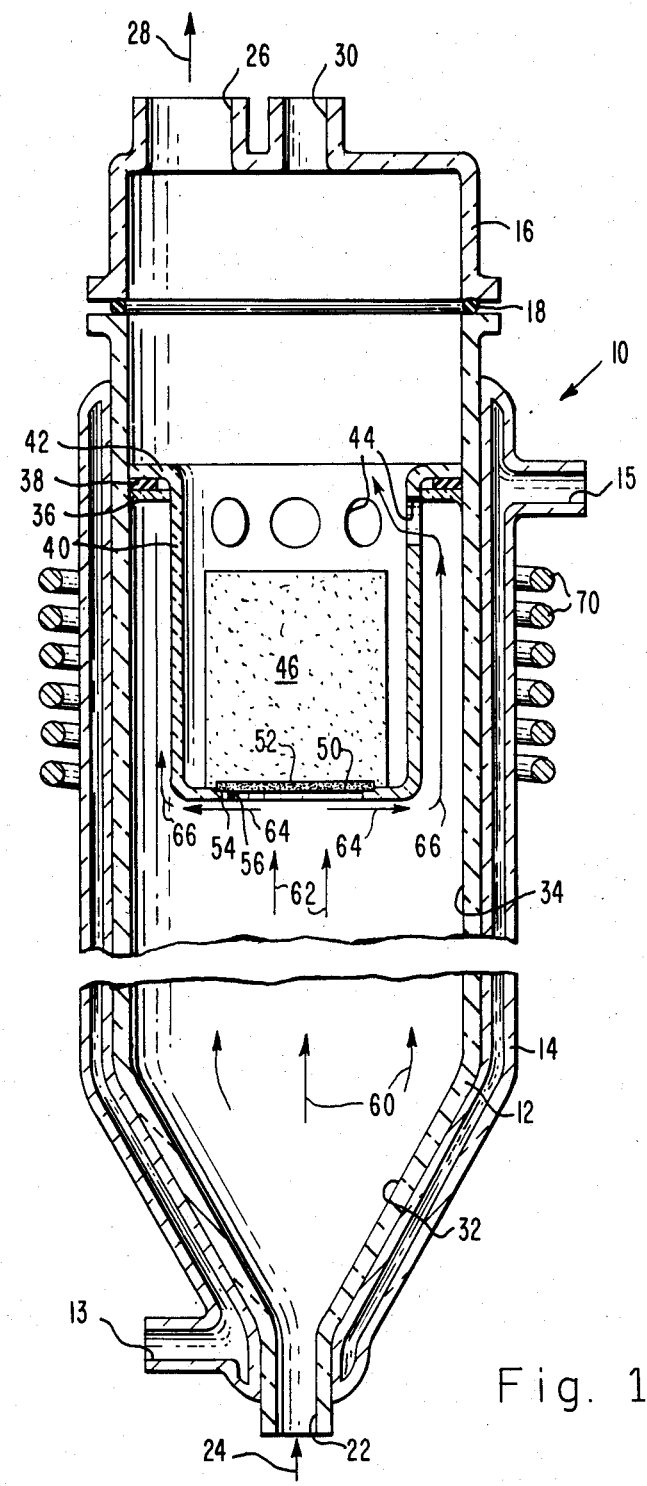
FIG. 1 is a sectional view of a preferred embodiment of the reactor chamber of the present invention.

Referring now to FIG. 1, a reactor chamber 10 constructed according to the present invention and suitable for use in a conventional CVD reactor system is shown. The reactor 10 is comprised of a glass reactor tube 12 and a glass reactor tube cap 16. A gasket 18 is provided between the reactor tube 12 and cap 16 so as to permit an air tight seal to be formed between the tube and cap.

A substantial length of the reactor tube 12 encloses a substantially cylindrical volume, preferably having a circular cross-section, that is defined by the inner reactor tube surface 34. The length of this portion of the reactor chamber is generally at least twice its diameter and preferably between three and ten times its diameter. The reactor tube 12 is oriented vertically such that the reactor cap 16 is positioned above the remainder of the reactor chamber 10. The lowest portion of the reactor tube 12 is configured so as to provide a generally cylindrical funnel shaped inner reactor tube surface 32 terminating as a gas inlet 22 at the lowest point of the reactor tube 12. The taper of this funnel shaped portion of the reactor 10 should be less than approximately 50° as measured from the vertical mid-line of the reactor tube 12 and preferably between 20° and 30°.

A supporting lip 36, inwardly protruding from the cylindrical inner reactor tube surface 34, provides support for a pedestal 40, susceptor 46, and substrate 50 subassembly. The pedestal 40 is a generally cup shaped cylinder having a wall portion terminating at the top-most portion of the pedestal 40 as an outwardly extending flange 42. The wall portion extends inward at right angles at the bottom-most portion of the pedestal 40 to form a pedestal base portion having an opening 56 therein. A number of holes 44 are symmetrically located in the wall portion of the pedestal 40 such that preferably the top-most portion of the holes 44 are level with the lower surface of the flange 42. The pedestal 40 is mounted within the reactor tube 12 by placing the outwardly extending flange 42 over the upper surface of the lip 36 so as to be supported thereby. An optional spacer 38 may be provided between the supporting lip 36 and the flange 42. In this manner, the cylindrical axis of the pedestal 40 is maintained coextensive with the mid-line of the reactor tube 12. Equally, the lower end portion of the pedestal 40 is maintained in a plane substantially perpendicular to the vertical mid-line of the reactor tube 12. The opening 56 is provided in the base portion of the pedestal 40 so as to also be symmetrically centered about the mid-line of the reactor tube 12.

Optimally, the pedestal 40 should comprise a material that releases no contaminants into the reactor chamber when periodically exposed to prolonged high temperatures at atmospheric and sub-atmospheric pressures. Alternately, the material should be such that any contaminating species released be electrically inactive in the particular semiconductor material of the epitaxial or dielectric layer being grown. The pedestal 40 material should also have sufficient structural strength to support the susceptor 46 and be sufficiently machinable to be formed into the appropriate shape. Thus, for gallium arsenide and related compound and compound alloy semiconductor materials, the preferred material for the pedestal 40 is pyrolytic boron nitride (PBN). PBN is essentially non-contaminating and, further, both boron and nitrogen are electrically inactive in gallium arsenide. Consequently, a PBN pedestal 40 can be used for the growth of all III-V compounds as well as most other compound semiconductor epitaxial layers. Other suitable pedestal 40 materials include silicon oxide (quartz) for the growth of silicon and silicon carbide and tungsten or molybdenum oxide for the growth of cadmium telluride compounds.

The inner base portion surface of the pedestal 40 is recessed uniformly, concentric about the opening 56, so as to receive the substrate 50. This ensures that the substrate 50 will be inherently aligned perpendicular to and symmetric about the mid-line of the reactor tube 12. The susceptor 46, preferably a solid cylindrical block of graphite optionally coated with a sealing layer of silicon carbide, uniformly rests atop the substrate 50. The contacting surface 52 of the susceptor 46 is recessed such that the substrate 50 acts to interlock the pedestal 40 with the susceptor 46, thereby ensuring retention of the desired alignment of the substrate 50.

External to the reactor tube 12, a water cooling jacket 14, having a water inlet 13 and outlet 15, is provided to permit the direct temperature control of the inner reactor tube surfaces 32, 34. Additionally, a conventional RF coil 70 is positioned opposite the susceptor 46 so as to enable the induction heating of the susceptor 46 and, in turn, the substrate 50. Optionally, a radiation heater of conventional design can be employed to heat the substrate 50 instead of the RF coil 70 and susceptor 46. As with the susceptor 46, the radiation heating element is preferably positioned in the pedestal 40 cavity and in close proximity with the substrate 50. In either case, a thermocouple (not shown) is preferably inserted through the electrical lead opening 30 in the reactor tube cap 16 and into the pedestal 40 cavity so as to permit an external dynamic determination of the substrate 50 temperature. Regardless of the number and nature of the electrical leads passing through the opening 30, the opening 30 is preferably sealed air tight.

In operation, a mixture of reactant gases enters the reactor chamber 10 through the inlet 22 as indicated by the arrow 24. The entering gas flow is inherently turbulent to some degree, thereby ensuring that the various constituent components are uniformly distributed within the gas mixture. Upon entering the portion of the reactor tube 12 delimited by the funnel shaped inner reactor surface 32, the gas propagation transits, in accordance with the present invention, into plug flow. Plug flow is hereby defined as a substantially laminar gas flow characterized as occurring in compressible gases at densities such that the mean collision distance between the gas phase atoms and molecules is substantially less than the minimum cross-sectional diameter of the flow. The desirable consequence is that the short term vector velocity of the gaseous phase atoms and molecules within the gas flow is substantially uniform. Naturally, the angle of the inner tube surface 32 away from the reactor mid-line must be sufficiently small to permit the rectant gas to transit into plug flow. To this end, 50° is generally the largest angle that can be used when using a non-compound conical surface such as surface 32.

Figure 2:
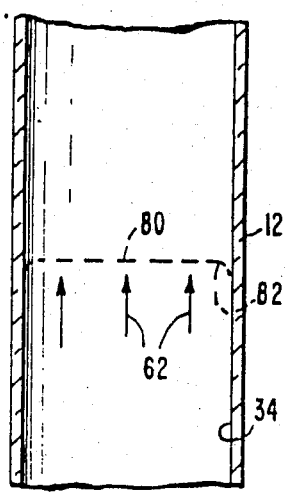
FIG. 2 is a detail sectional view of a portion of the reactor chamber shown in FIG. 1.

To better describe the application of plug flow to the present invention, reference is now made to FIG. 2 wherein a detail section of the reactor chamber 10 is shown. The substantially uniform plug flow of the reactant gases passing vertically upward in the reactor tube 12 is indicated by the arrows 62. Since the gases have a substantially uniform vector velocity, a stationary front 80, relative to the plug flow gasses, can be shown to illustrate the uniform motion of the plug flow. The only non-uniformity in the front 80, designated as 82, occurs in close proximity to the tube surface 34 as the result of the existance of a boundary layer. Due to the inherent shear stresses that arise in a viscous fluid, such as the reactant gas mixture, the vector velocity of the gas flow is reduced close to the reactor tube surface 34, thereby creating the boundary layer. Consequently, the gas interface 82 within the boundary layer is non-uniform and, to some degree, turbulent. This flow non-uniformity is inconsequential, however, as will be explained below.

Consistent with the present invention, gaseous mixtures having differing constituent gas phase components can be sequentially introduced into the reactor 10 without significant intermixing of the gaseous components. Between each of the different sequentially introduced gas mixtures, a gas mixture interface, suitably illustrated by the front 80, is effectively created. Ideally, the only intermixing of the two gas mixtures results from random diffusion. The common and substantially uniform vector velocity of the gases in both gas mixtures substantially precludes turbulent mixing. The only source of significant intermixing arises as a result of the boundary layer formed at the inner surface of the reactor tube 34. The intermixing, however, is slight and, as will be shown below in connection with an alternate embodiment of the present invention, can be further reduced to insignificance.

Again referring to FIG. 1, the plug flow of reactant gases indicated by the arrows 62 is directed substantially perpendicular toward the exposed surface of the substrate 50. Being in close thermal contact with the susceptor 46, the substrate 50 is heated as a direct consequence of the induction heating of the susceptor 46 by the RF coil 70. The substrate 50 can thus be maintained at a temperature above the thermal decomposition temperature of the particular reactant gas compounds present. As the reactant gas mixture approaches the substrate 50, the various compounds decompose, with the desired fractions being inertially deposited upward onto the growth surface of the substrate 50. The plug flow of the reactant gas mixture, and the uniform distribution of the various constituent components thereof, ensures that a uniform partial pressure of the reactant gas compounds is present to decompose below the entire growth surface of the substrate. This, in turn, results in a substantially uniform deposition layer growth, both in terms of thickness and composition. The remaining fractions of the reactant gas compounds, being volatile, exit radially from the vicinity of the substrate 50 as indicated by the arrows 64. These fractions, typically hydrogen and simple hydrocarbons, have no significant effect on the plug flow of the reactant gas mixture whose path they traverse, since they are of very low molecular weight and move uniformly away from the center of the exposed substrate growth surface consistent with the inherently existing thermal gradient. These heated fractions, along with any unreacted portion of the reactant gas mixture and the carrier gas, move freely upward between the pedestal 40 and the reactor tube wall 34, as indicated by the arrows 66, through the pedestal holes 44 and into the upper chamber of the reactor 10 formed by the reactor cap 16. From there, the gas exits through the outlet 26 as indicated by the arrow 28. Naturally, the unreacted portion of the reactant gas mixture includes that portion present in the boundary layer as it passed by the pedestal base. Thus, the most turbulent portion of the plug flow has no significant effect on the uniformity of the deposited layer.

It should be noted that the length of the cylindrical portion of the reactor tube 12 is critical only insofar that it must be sufficiently long to effectively isolate the plug flow of reactant gas at the substrate 52 from the turbulent flow of reactant gas entering the reactor chamber 10. Placement of the substrate 52 too close to the funnel-shaped portion of the reactor tube 12, due to the use of too short a cylindrical portion thereof, may impede the transition of the reactant gas into plug flow. Consequently, a minimum length of approximately twice the inside diameter of the cylindrical portion of the reactor tube 12 is the preferred minimum length for the cylindrical portion of the reactor tube 12.

In accordance with the present invention, the design of the reactor chamber 10 effectively precludes both auto- and delayed-doping. The smooth contour of the reactor tube 12 inner surfaces and the placement of the gas exit holes 44 symmetrically about the pedestal 40 immediately below the support flange 42 preclude the existance of dead spaces that could delay dopants from reacting the substrate. Also, dopants evaporating from the inner surfaces of the reactor tube 12 substantially remain in the boundary layer and, therefore, never reach the substrate growth surface. Dopants evaporating from the walls of the pedestal 40 are swept upward and away from the general vicinity of the substrate. Thus, practically every source of delayed dopants is effectively eliminated.

The various contaminant sources that gives rise to auto-doping are similarly eliminated. Contaminants evaporating from the reactor tube inner surfaces 32, 34 are effectively prevented from reaching the substrate 50 by the boundary layer. Contaminants sourced by the graphite susceptor 46, its silicon carbide coating, or the back surface of the substrate 50 within the cavity of the pedestal 40 are sealed from reaching the substrate growth surface by the interlocked mating of the substrate 50 and the pedestal 40. Further, any such contaminants are swept upward and generally away from the growth surface with the gas passing through the holes 44 and exiting via the outlet 26. Any contaminants directly sourced by the pedestal 40 are, by the preferential choice of the pedestal material, effectively non-contaminating in the growth layer material. Thus, layers grown in the reactor chamber 10 of the present invention are substantially free of auto-dopants.

The foregoing, in combination wih the plug flow delivery of the reactant gases into close proximity with the substrate growth surface, permits the growth of layers having an extremely uniform composition. The exclusion of extraneous dopants and undesirable contaminants allows the composition of the layer grown to be strictly controlled by the relative amounts of the various compounds provided in the reactant gas mixture. This allows precisely graded as well as abrupt changes in the composition of the layer grown to be achieved by appropriately altering the composition of the reactant gas mixture provided to the reactor chamber 10.

Figure 3:
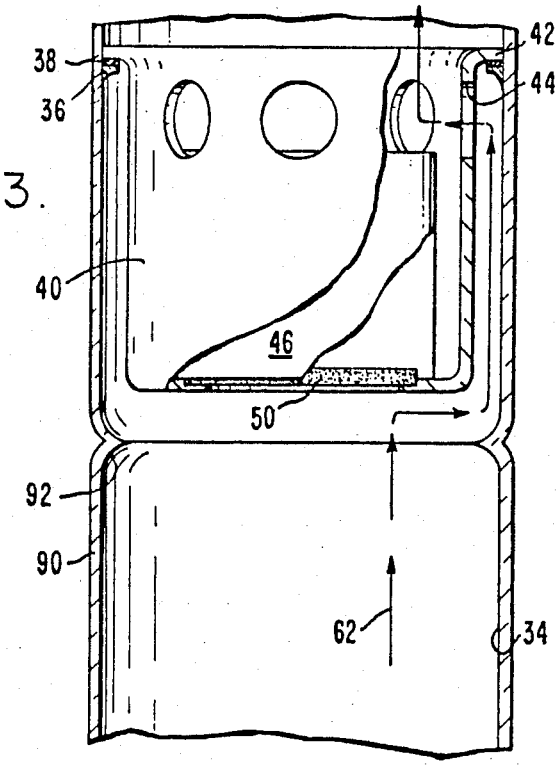
FIG. 3 is a sectional view, partially in cut-away, of a portion of an alternate preferred embodiment of the reactor chamber of the present invention.

A detailed section of the reactor chamber 10 adapted to provide an alternate embodiment of the present invention is shown in FIG. 3. As with the reactor chamber 10 shown in FIG. 1, the pedestal 40, substrate 50, and susceptor 46 sub-assembly is supported from a lip 36 attached to and inwardly protruding from a reactor tube 90. The spacer 38 is optionally provided between the flange portion 42 of the pedestal 40 and the supporting lip 36. The reactor tube 90 differs from the reactor tube 12 of the previous embodiment in that the tube 90 is constricted below the lowest portion of the pedestal 40 so as to form an orifice 92. The purpose of the orifice 92 is to create a phenomenon known in fluid mechanics as a vena contracta in the gas plug flow immediately prior to the exposed surface of the substrate 50. This phenomenon is generally well known in the art. See, "A Practical Guide to Gas Flow Control", *Instruments and Control Systems,* D. B. LeMay, September 1977.

Figure 4:
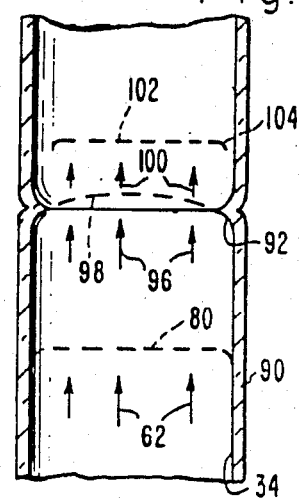
FIG. 4 is a detail sectional view of a portion of the reactor chamber shown in FIG. 3.

The application of the vena contracta phenomenon in the present invention is illustrated in the detailed section shown in FIG. 4. As in the first preferred embodiment of the present invention, a typical reactant gas plug flow, indicated by the arrows 62 and front 80, progresses vertically upward in the reactor tube 90. Upon encountering the orifice 92, the front 80 is uniformly distorted as the central portion of the gas flow, indicated by the arrow 96, passes through the orifice 92 faster than the surrounding portions of the plug flow gas. As a consequence of passing through the orifice 92, the gas flow becomes detached from the inner surfaces of the reactor tube 90. As the non-uniform front 98 passes beyond the orifice 92, its shape continuously varies and the gas flow eventually reattaches to the inner surfaces of the reactor tube 90 and continues on in typical plug flow. However, at some intermediate point between passing through the orifice 92 and reattachment with the reactor tube wall 90, a substantially uniform front 102 exists. This point is the vena contracta. The virture of the vena contracta front 102 is that, in being unattached to the walls of the reactor tube 90, only a slight boundary layer portion 104 of the front 102 is deformed due to the existance of a boundary layer, also detached from the tube wall 90.

Referring again to FIG. 3, the placement of the orifice 92 relative to the growth surface of the substrate 50 is preferably such that the detached vena contracta front 102 is located at the growth surface of the substrate 50. This results in a significant improvement in the uniformity of the partial pressure of the reactant gas compounds over the exposed surface of the substrate 50, particularly its periphery. A corresponding improvement in the thickness and composition uniformity of the CVD grown layer is thus also realized. To place the vena contracta at the growth surface, spacers 38 of varying vertical thicknesses may be provided between the flange portion 42 of the pedestal 40 and the supporting lip 46 to adjust the distance of the growth surface of the substrate 50 from the orifice 92. The distance between the orifice 92 and the substrate 50 growth surface is dependent on the particular construction of the reactor chamber 10. However, the proper distance can be easily determined for any reactor chamber constructed in accordance with present invention by simple and ordinary experimentation including growing single layers utilizing spacers 38 of successively different thicknesses until there is convergence on a spacer 38 thickness that permits the growth of substantially uniform layers. All other aspects of this alternate embodiment are strictly analogous to that of the principle embodiment described above.

Figure 5:
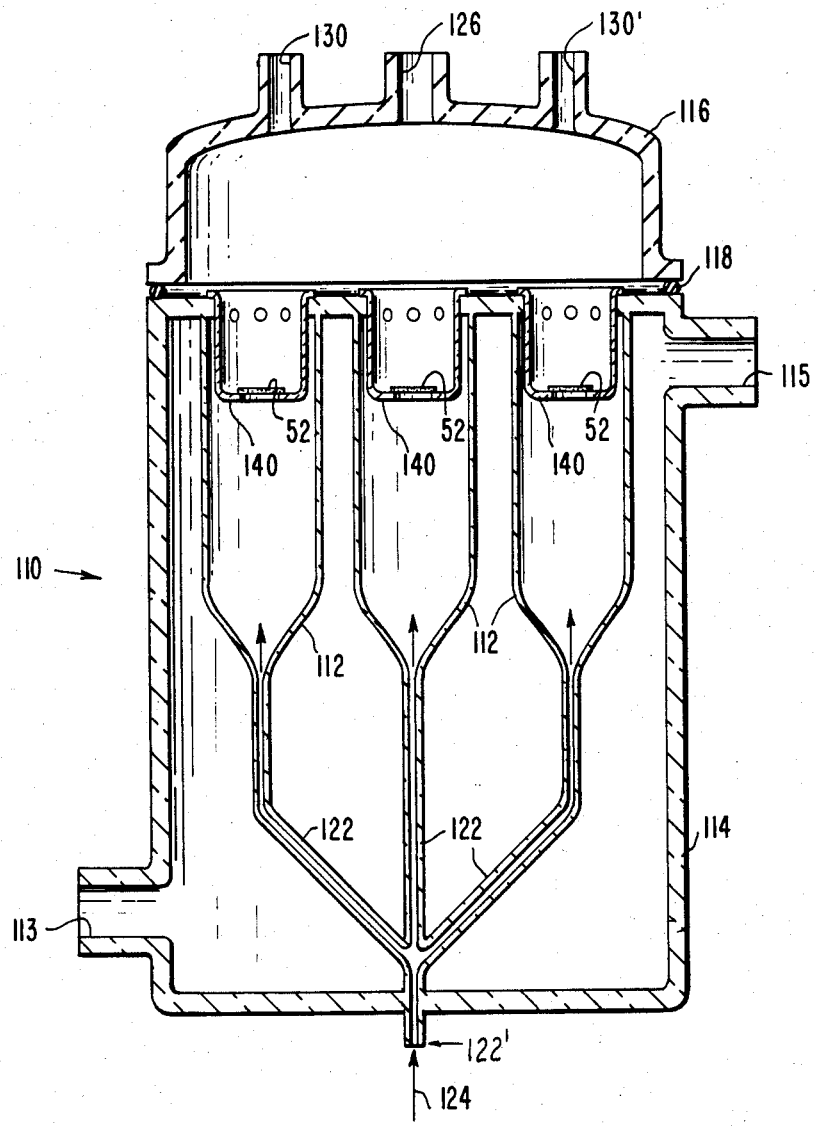
FIG. 5 is a sectional view of a multiple tube reactor chamber.
Figure 6:
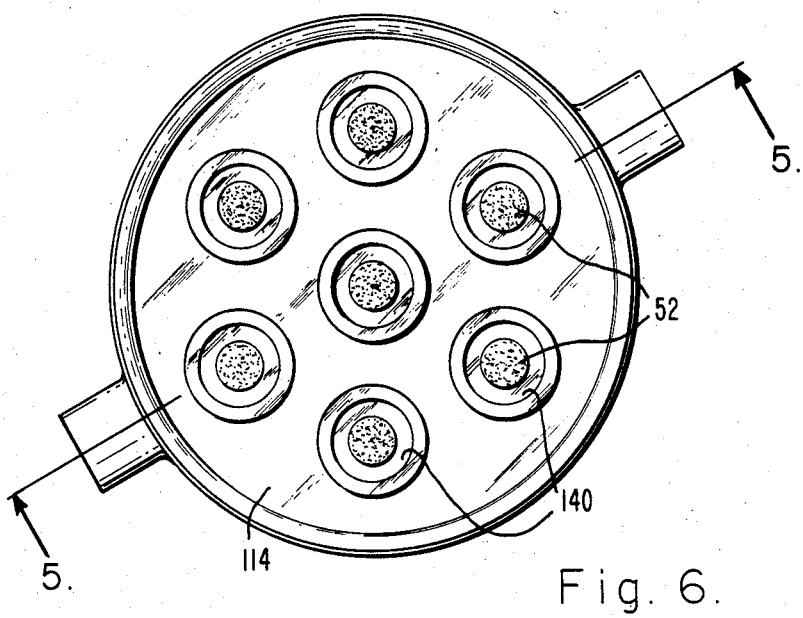
FIG. 6 is a top view of a cross section of the multiple tube reactor chamber shown in FIG. 5.

Another alternate embodiment of the present invention is shown in FIG. 5. The reactor chamber 110 includes a parallel vertical array of reactor tubes 112, each essentially identical to the reactor chamber 10 shown in FIG. 1. The reactor tubes 112 are preferably housed within a common water jacket 114 having a cooling water inlet 113 and a water outlet 115. A common reactant gas inlet 122' permits reactant gas, indicated by the arrow 124, to be provided to each of the reactor tubes 112 in equal proportion via the respective connecting gas lines 122. The reactor chamber 110 differs from the single reactor tube chamber 10 in that the reactor tubes 112 share a common reactor tube cap 116 that is sealed at its outer perimeter to the water jacket 114 by a gasket 118. The reactant gas outlet 126 permits the carrier gas, decomposition reaction products, and any remaining undecomposed transport compounds that pass from each of the reactor tubes 112 to be removed from the reactor chamber 110. Electrical lead ports 130, 130' are provided in the reactor cap 116 to permit the installation of thermo-couples and radiation heaters within the cavity of each of the pedestals 140, immediately above the semiconductor substrates 52. Radiation heaters are preferred over RF heated susceptors since the uniform induction heating of multiple susceptors by a single RF coil would be extremely difficult to attain. The radiation heaters and thermo-couples are of conventional design and, for purposes of clarity, not shown in FIG. 5. As shown in FIG. 6, a top cross sectional view of a multiple reactor tube chamber 110, the reactor tubes 124 are preferably arrayed symmetrically with respect to one another so as to optimize the overall operation of the reactor chamber 110 and the uniformity of the layers simultaneously grown on the respective semiconductor substrates 52.

EXAMPLE

A reactor chamber of the type shown in FIG. 1 was constructed in accordance with the present invention. The reactor chamber had an overall length of 63.5 cm with a substantially constant diameter of 88 mm within the cylindrical portion thereof. The internal surface of the funnel shaped portion of the reactor tube was angled at approximately 25° from the mid-line of the reactor chamber. A PBN pedestal having an external diameter of 72 mm and overall height of 84 mm was supported from a protruding lip located 75 mm below the top of the reactor tube. A RF coil was positioned opposite a graphite susceptor having a diameter of 62 mm and overall height of 62 mm.

Utilizing the above reactor chamber, accurately reproducible epitaxial layers were grown by MOCVD to a thickness of 34 $\mu$m over an area of 12.5 cm$^2$ on the surface of a 50 mm diameter semiconductor wafer. Thickness uniformity of these layers were within at least $\pm 1\%$ with uniform dopant concentrations of within at least $\pm 2\%$. Also utilizing the above reactor chamber, P-type GaAs epitaxial layers 8.5 micrometer thick were grown by MOCVD with carrier concentrations as low as $7 \times 10^{11}$ cm$^{-3}$ and resistivities as high as 40K ohm-cm. The room temperature Hall mobilities of these layers were as high as 450 cm$^2$/volt-sec.

Thus, an inverted positive vertical flow chemical vapor deposition reactor chamber that enables the deposition of physically uniform, both in terms of thickness and composition, high electrical quality layers on an exposed surface of a semiconductor substrate has been disclosed. Obviously, many modifications and variations of the present invention are possible in light of the above description of the preferred embodiments. These modifications may include alternate apparatus for establishing plug flow of the reactant gases within the reactor tube, operation of the reactor chamber at less than atmospheric pressure, and the utilization of alternate cooling devices to establish and maintain the operating temperature of the reactor tube walls. It is therefore to be understood, that within the scope of the appended claims, the invention may be practiced otherwise than is specifically described above.

What is claimed is:

1. A chemical vapor deposition (CVD) reactor system comprising a vertical reactor chamber, a source of a reactant gas compound having a deposition component as a fraction thereof, means for introducing said reactant gas compound into said reactor chamber, and a substrate having a major surface suitable for receiving said deposition component, wherein said reactor chamber comprises:

(a) a pedestal having
    means for securing said substrate to said pedestal such that said major surface is exposed facing downward and having means above said substrate for removing any residual amounts of said reactant gas components and any residual decomposition reactant products;

(b) means for heating said substrate to a temperature sufficient to induce the decomposition of said compound when provided in close proximity with the exposed surface of said substrate;

(c) said reactor chamber being constructed so as to induce a vertical upward plug flow of said compound introduced into said reactor chamber to be positively directed into close proximity with the exposed surface of said substrate, so that said decomposition component is positively directed onto the exposed major surface of said substrate.

2. The reactor chamber of claim 1 wherein said pedestal further comprises:

(a) a base portion facing downward, said base portion having a hole therein; and (b) a securing means included in a recessed portion of said base portion of said pedestal adapted for receiving said substrate such that said substrate is supported above said hole and sealed against said pedestal base portion, said major surface being exposed via said hole.

3. The reactor chamber of claim 1 or 2, being structured to provided a plug flow further comprising: a reactor tube having upper and lower tube portions, the inner surface of said upper tube portion defining a substantially cylindrical volume, the cylindrical axis of said upper tube portion being substantially vertical, the inner surface of said lower tube portion defining a substantially uniform funnel shaped volume contiguous within the cylindrical volume enclosed by said upper tube portion, said introducing means providing said compound in said lower tube portion substantially at the vertex of the funnel shaped volume, so that said compound transitions into plug flow as it moves vertically upward within said lower tube portion and is substantially maintained in plug flow as it moves vertically upward within said upper tube portion.

4. The reactor chamber of claim 3 wherein said upper tube portion has a cylindrical length of approximately two or more times the inside diameter of said upper tube portion.

5. The reactor chamber of claim 4 wherein said upper tube portion has a cylindrical length of between approximately three and ten times its cross-sectional diameter.

6. The reactor chamber of claim 4 wherein the inner surface of said lower tube portion is tapered at an angle of less than approximately 50° as measured from the vertical mid-line of said reactor chamber.

7. The reactor chamber of claim 3 wherein said removing means is located within an upper portion of said pedestal having an outwardly extending flange generally sealing a lower portion of said upper tube portion from an upper portion thereof, said pedestal upper portion further having a plurality of holes therein connecting said upper and lower portion of said upper tube portion.

8. A chemical vapor deposition reactor system comprising:

(a) a reactor tube cap having a gas outlet; and (b) a reactor tube having:

(i) an upper portion connected to said cap, the inner surface of said upper tube portion defining a substantially uniform cylindrical volume and having a substantially vertical axis, and (ii) a lower tube portion, contiguous with said upper tube portion, and including a gas inlet, the inner surface of said lower tube portion defining a uniform funnel shaped volume and providing a smooth transition from said gas inlet to said upper tube portion, said gas inlet being positioned at the vertex of said lower tube portion such that gas introduced at said gas inlet forms a substantially uniform plug flow within said lower tube portion;

(c) means for supporting a substrate for growing a single crystal on a major surface thereof, wherein said support means include means for supporting the major surface of the substrate in a downward facing position, said support means positioned in said upper portion of said reactor tube (1) such that gas enters said upper portion below the substrate and exits above the substrate and (2) such that the substrate is substantially symmetrically centered about and substantially perpendicular to the cylindrical axis of said upper tube portion;

(d) means for heating a substrate; on the support means.

9. The reactor chamber of claim 8 wherein said upper tube portion includes a constriction forming an orifice symmetrically centered about and in a plane perpendicular to the cylindrical axis of said reactor tube, said orifice being positioned below the exposed surface of the substrate, and constructed so as to form a vena contracta in the gas mixture after passing through said orifice and immediately adjacent the exposed substrate surface.

10. The chemical reactor deposition system of claim 8 wherein the means for supporting a substrate is a pedestal.

11. The reactor chamber of claim 10 wherein said pedestal is comprised of an effectively non-contaminating material.

12. The reactor chamber of claim 11 wherein said pedestal material is pyrolytic boron nitride.

13. The reactor chamber of claim 11 wherein:

(a) said reactor tube includes a support lip inwardly protruding from the inner surface of said upper tube portion;

(b) said pedestal includes:

(i) a cylindrical wall portion having a plurality of holes therein and an outwardly extending flange portion at the upper extreme of said wall portion, said flange overlying said support lip so as to permit said pedestal to be mounted within said reactor tube; and (ii) means for securing said substrate having a pedestal base portion at the lower extreme of said pedestal cylindrical wall portion, said pedestal base portion having a hole symmetrically centered therein and the upper surface of said base portion having a recess concentric about said hole so as to securely receive said substrate and expose a surface thereof facing downward.

14. The reactor of claim 13 wherein said upper tube portion has a cylindrical length of approximately two or more times the inside diameter of said upper tube portion.

15. The reactor chamber of claim 14 wherein said upper tube portion has a cylindrical length within an approximate range of three to ten times the inside diameter of said upper tube portion.

16. The reactor chamber of claim 14 wherein the inner surface of said lower tube portion is angled away from the vertical mid-line of said reactor chamber at an angle of less than approximately 50°.

* * * * *